(12) United States Patent
Ch'ng et al.

(10) Patent No.: US 7,760,558 B2
(45) Date of Patent: Jul. 20, 2010

(54) VOLTAGE BOOSTER BY ISOLATION AND DELAYED SEQUENTIAL DISCHARGE

(75) Inventors: Chin-Ghee Ch'ng, Gelugor (MY); Kuan-Cheng Tang, Penang (MY)

(73) Assignee: Spansion LLC, Sunnyvale, CA (US)

( * ) Notice: Subject to any disclaimer, the term of this patent is extended or adjusted under 35 U.S.C. 154(b) by 261 days.

(21) Appl. No.: 12/014,454

(22) Filed: Jan. 15, 2008

(65) Prior Publication Data
US 2009/0180345 A1    Jul. 16, 2009

(51) Int. Cl.
*G11C 7/00* (2006.01)

(52) U.S. Cl. .......................... 365/189.11; 365/189.09; 365/181

(58) Field of Classification Search ............ 365/189.11, 365/189.09, 191
See application file for complete search history.

(56) References Cited

U.S. PATENT DOCUMENTS

| | | | |
|---|---|---|---|
| 5,097,226 A * | 3/1992 | Pascucci et al. ............... | 331/46 |
| 6,084,800 A | 7/2000 | Choi et al. | |
| 6,157,243 A * | 12/2000 | Tailliet .......................... | 327/536 |
| 6,327,194 B1 | 12/2001 | Kurihara et al. | |
| 6,483,376 B1 * | 11/2002 | Bienvenu et al. ............... | 327/536 |
| 6,542,411 B2 | 4/2003 | Tanikawa et al. | |
| 6,798,275 B1 | 9/2004 | Le et al. | |
| 6,943,603 B2 * | 9/2005 | Jinbo .......................... | 327/171 |

* cited by examiner

*Primary Examiner*—Connie C Yoha
(74) *Attorney, Agent, or Firm*—Turocy & Watson, LLP

(57) ABSTRACT

Systems and methods for improving efficiency of a voltage booster for read mode operations of memory cells and discharging a boosted supply voltage safely are disclosed. The system contains a plurality of boosting stages coupled in series including a plurality of boosting capacitors, a plurality of isolators. The isolator can be used to prevent boosting of one capacitor from negatively affecting a charge of the other adjacent capacitor to improve the efficiency of the voltage booster. A voltage booster circuit can accurately boost a supply voltage with a suitable number of boosting stages depending on a level of the supply voltage being provided. Since boosters contain a suitable number of boosting stages, the boosters can discharge a boosted voltage sequentially. With this sequential discharge method, memory cells can not have a hot switching problem.

20 Claims, 7 Drawing Sheets

| Potential across capacitor | Before discharge | First discharge | Second discharge | Third discharge |
|---|---|---|---|---|
| Stage 3 | 2 X Vcc | Vcc | Vcc | Vcc |
| Stage 2 | 3 X Vcc | 2 X Vcc | Vcc | Vcc |
| Stage 1 | 4 X Vcc | 3 x Vcc | 2 X Vcc | Vcc |

VOLTAGE BOOSTER BY ISOLATION AND DELAYED SEQUENTIAL DISCHARGE

TECHNICAL FIELD

Disclosed are voltage boosters and methods for improving efficiency of a voltage booster for read mode operations, preventing over boosting, and/or discharging a voltage safely in a voltage booster circuit with one or more stages.

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and NAND flash, for example. NOR flash evolved from electrically erasable read only memory (EEPROM) chip technology, in which, unlike flash, a single byte can be erased; and NAND flash evolved from DRAM technology. Flash memory devices are less expensive and denser as compared to many other memory devices, meaning that flash memory devices can store more data per unit area.

NOR Flash memory architecture is an array of Flash EEPROM cells (floating gate devices) which are divided into a plurality of sectors. Further, the memory cells within each sector are arranged in rows of wordlines and columns of bitlines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

Flash memory devices can include a number of sectors that can include word lines and bit lines associated with memory cells to or from which data can be written and/or read. Each sector can include a plurality of memory cells. Further, each sector can include a boost-strap node to which a voltage can be applied in order to facilitate writing or reading data to/from the flash memory. During a read operation, a voltage source can supply a voltage, so that the respective voltage levels at the boost-strap nodes respectively associated with each of the sectors can be increased to a desired voltage level. The boost-strap node can facilitate enabling the signal at the vertical word line to pass to the memory cell word line to facilitate the reading of data from the memory cell associated with the memory cell word line. The desirable amount of time to raise the boost-strap node voltage to the desired voltage level can be limited. Further, parasitic elements can delay the increase of the voltage level in the boost-strap nodes and/or introduce inconsistencies between the voltage ramp rates of the boost-strap nodes of respective sectors, where such parasitic elements can include resistance in the channel associated with the boost-strap nodes as well as stray capacitance, which can result from the routing of the circuitry in the device.

As is generally known in the field of semiconductor memory devices and other semiconductor integrated circuits, it is often required to generate internally voltages that are greater than an external voltages, also known as off-chip power supply voltages. For example, it is known in flash EEPROMs that a first high voltage of about +5V is needed to be produced for the read mode of operation of memory cells. Also, a second high voltage of about +10V is needed to be produced for the program mode of operation of the flash memory cells. To meet this requirement, the semiconductor memories also generally include one or more internal voltage boosting circuits for generating output signals boosted to be higher than an external supply voltage.

Conventional boosted voltage circuits generate a boosted voltage and apply the boosted voltage to a word line for read mode operations of memory cells. In such conventional boosted voltage circuit, the boosted voltage varies with supply voltage levels, process corners, and temperature. Thus, the boosted voltage is not accurate and causes errors to occur during read mode operations of memory cells. Such variations of the boosted voltage degrade an ability in a read mode circuitry to discriminate accurately whether or not a cell is programmed. In addition, as device densities and memory speed requirements continue to increase, a speed requirement of the boosted voltage circuit may need to increase to keep pace with a remainder of the memory circuit. Further, as supply voltage levels decrease with the higher density architectures, conventional boosted voltage circuits may be inadequate to supply a required boost voltage. As supply voltage levels decreases with the higher density architectures, a single stage voltage booster circuit may be inadequate to supply the required boosted voltage.

SUMMARY

The following presents a simplified summary of the innovation disclosed herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

Voltage booster circuits described herein can include a boosting system for boosting a supply voltage of memory cells and/or a discharging system for discharging a boosted voltage of the voltage booster circuits. The boosting system can contain one or more boosting stages coupled in series including one or more boosting capacitors, one or more isolators and a regulator. The isolator can be used to prevent boosting of one capacitor from negatively affecting a charge of an adjacent capacitor. As a result, the adjacent capacitor in a charging stage has substantially no leaky path or charge sharing to the capacitor being boosted because of the isolator. By containing the isolator between the boosting stages, the boosting system can improve efficiency of the voltage booster. The boosting system can accurately boost a supply voltage with a suitable number of boosting stages depending on a level of the supply voltage being provided. When the level of the supply voltage is relatively high, the boosting system can reduce the number of voltage boosting stages. This operation can prevent over boosting.

The discharging system can include an isolator that electrically isolates two capacitors from each other when one of the two capacitors discharges a boosted voltage. The isolator can be used to prevent and/or mitigate a flow of a charge from an adjacent capacitor into a capacitor when the capacitor discharges the boosted voltage. By containing the isolator between the discharging stages, the efficiency of the booster can be improved.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

BRIEF DESCRIPTION OF THE DRAWINGS

FIG. 5 is a table of potentials across three capacitors in three stages (during discharging) of an exemplary voltage booster circuit in accordance with a fifth aspect of the innovation.

DETAILED DESCRIPTION

Figure 1:
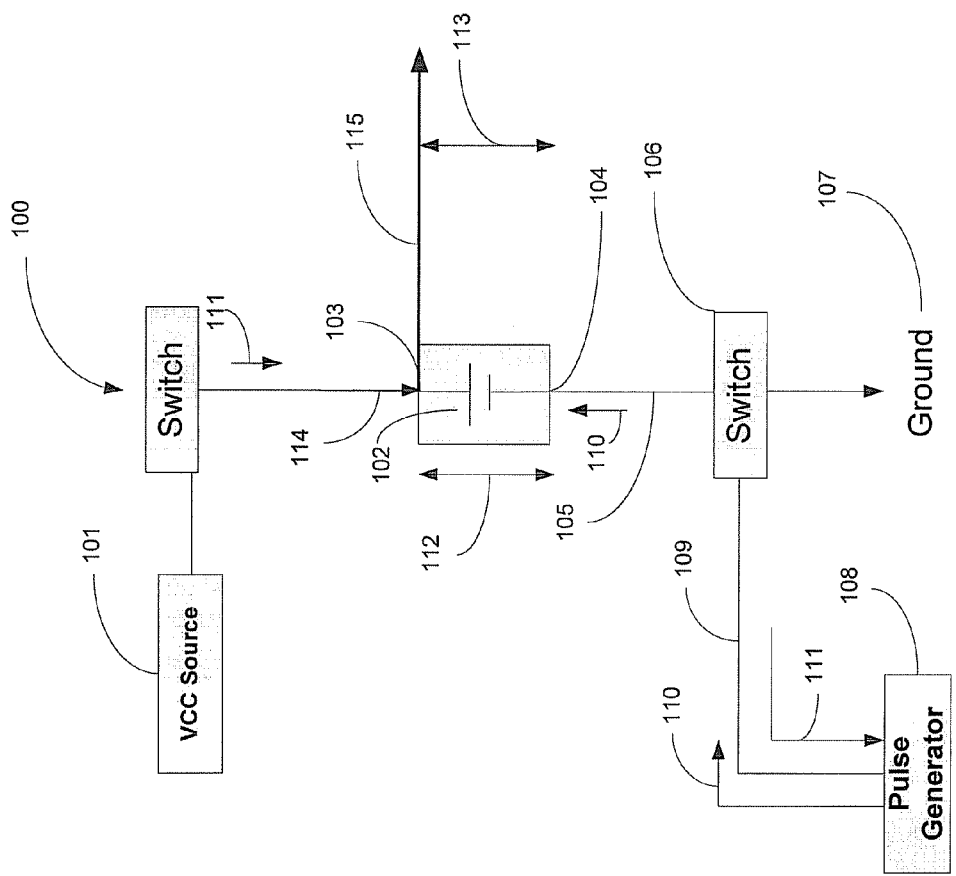
FIG. 1 illustrates an operation of an exemplary single voltage boosting stage in accordance with a first aspect of the innovation.

Memory devices, such as flash memory devices, are progressively increasing in density, and as a result, the number of sectors in a vertical word block of a flash memory device is increasing to facilitate achieving the desired density. Further, routing channels in memory devices are becoming more narrow and routing more compact to facilitate achieving higher density in memory devices. As a result, parasitic elements (e.g., undesirable resistance and capacitance) can become more problematic, and can increase the longer the distance a voltage source is from the destination to be supplied with the voltage.

Systems and/or methods are presented that facilitate countering the parasitic elements to facilitate performing read operations at a desirable speed to read data from memory. In order to make sure reading in a short time (e.g., 80 ns) with a memory device (e.g., a NOR-flash memory device), a fast and clean voltage boosting system is required. Since a core cell gate does not consume a current in read operations, the only current it consumes is capacitive charging. Fortunately, a read booster does not need a fast pulse like in a charge pump. Once it is charged up and pushed out a charge, the output voltage level will remain high until a discharge path is activated.

The boosting system can include a memory that can include non-volatile memory, such as flash memory, quad-bit flash memory, read only memory (ROM), programmable ROM (PROM), erasable programmable read only memory (EPROM), electronically erasable programmable read only memory (EEPROM), and the like.

In a page-mode device, a booster typically has an enough time to get fully charged up to a rail voltage before a pulse signal comes in and pushing a charge to a higher potential or to a desired level.

A burst-mode device may have a problem when it reads at a high speed, especially during boundary crossing (switching to a new word line after approaching at an end of the present word line) when there is not enough timing window for booster's capacitors to discharge a power rail before licking again. As a result, a burst-mode device may have voltage variation on different word lines. A number of boosting stages need to be carefully designed too, especially for, for example, 3 volt memory devices.

In some flash memory devices (e.g., 2 G bit 65 nm flash memory devices), due to a long parasitic RC delay, a read booster is brought to a relatively higher level to decrease a read access time. This operation may cause another issue during discharging a boosted voltage as a voltage output could reach a relatively high voltage (e.g., 8 volt). The relatively high voltage may violate a design rule of a memory cell, and a memory cell (e.g., MODFET) cannot switch on due to the relatively high voltage at a drain terminal. Thus, the relatively high supply voltage (boosted voltage) cannot be simply discharged to the ground or VCC because it violates the design rule. The relatively high supply voltage needs to be discharged stage by stage.

One advantage of the boosting operation described herein is to control a boosted voltage within a user supply voltage range. In conventional memory devices, a number of voltage boosting stages can not be easily or accurately controlled. In one embodiment of the subject innovation described herein, a number of voltage boosting stages can be controlled by an Analog to Digital converter depending on a supply voltage level. For example, when a supply voltage is relatively high, a less number of voltage boosting stages are used. In another embodiment, boosting capacitors are electrically isolated from each other by isolators. In yet another embodiment, since boosters contain a suitable number of boosting stages, the boosters can discharge a boosted voltage sequentially. By sequentially discharging the boosted voltage, the memory device (e.g., MOSFET) may not have a hot switching problem.

The boosting/discharging systems and methods are now described with reference to the drawings, wherein like reference numerals are used to refer to like elements throughout. In the following description, for purposes of explanation, numerous specific details are set forth in order to provide a thorough understanding of the claimed innovation. It may be evident, however, that the claimed innovation may be practiced without these specific details. In other instances, well-known structures and devices are shown in block diagram form in order to facilitate describing the claimed innovation.

FIG. 1 illustrates an operation of a single voltage boosting stage 100. It illustrates how a capacitor 102 is charged up and boosts a charged voltage 112 to generate a boosted voltage 115. The voltage boosting stage 100 can be used as a charge pump. A charge pump is an electronic circuit that uses capacitors as energy storage elements to create either a higher or lower voltage power source. Charge pump circuits are capable of high efficiencies, sometimes as high as about 90% to about 95% while being electrically simple circuits.

To maximize efficiency of the boosting stage 100 and generate a higher voltage, a capacitor 102 needs to be fully charged up before starting boosting a charged voltage 112. To achieve such maximum efficiency, in a first (charging) stage, a positive terminal 103 of the capacitor 102 can be connected to a supply voltage source (VCC source) 101 and a negative terminal 104 of the capacitor 102 can be connected to the ground 107. A switch 106 is turned on to connect an output node 105 of the capacitor 102 to the ground 107. As a result, the output node 105 of the capacitor 102 is grounded. The capacitor 102 is being connected to a supply voltage 114 and the ground 107. Then, the capacitor 102 starts charging the supply voltage 114. When the capacitor 102 is fully charged up, a charged voltage 112 across the capacitor 102 is a level of the supply voltage (VCC) 114.

Generally, a capacitor is capable of charging an energy-storing device up to a level of an external supply. Thus, the capacitor 102 is capable of charging a quantity of voltage up to the level of the supply voltage 114. Another purpose of the charging device is to charge an energy-storing device to compensate for any level degradation that may occur from a pre-charging process.

In a second (boosting) stage, by application of a pulsed signal (kick signal) 110 on a node 109 to the negative terminals 104 of the capacitor 102, a mechanism of a pulsed signal pump 108 is triggered.

Once the capacitor 102 is fully charged up to the level of the supply voltage 114 in the first (charging) stage, the switch 106 is turned off to disconnect the output node 105 of the capacitor 102 to the ground 107 and connect the output node 105 of the capacitor 102 to the pulsed signal pump 108. As a result, the negative terminal 104 is connected to the pulse signal pump 108. Then, the rising pulsed signal 110 on the node 109 is applied at the negative terminal polarity 104. By applying the pulsed pulse signal 110 at the negative terminal polarity 104, the charged voltage 112 is boosted up. In other words, the pulsed signal pump 108 drives the output nodes 105, 109 on the rising edge of the pulsed signal 110 during boosting the charged voltage 112. Since the capacitor 102 retains the full charged voltage 112 across it ignoring leakage effects, a voltage boosting stage 100 can effectively double the charged voltage 112 when the rising pulsed signal 110 comes in and push the charge. A voltage boosting stage 100 can effectively generates a boosted voltage 115. The potential voltage 113 across the capacitor 102 would rise to 2 times the charged voltage (the supply voltage) 112 at the positive terminal 103.

FIG. 1 also illustrates how a fully charged capacitor 102 discharges a charged voltage 112. The pulsed signal pump 108 drives the output node 105, 109 on a falling edge of the pulsed signal 111 during discharging the charged voltage 112. Before discharging the charged voltage 112, the capacitor 102 is fully charged up 2 times the level of the supply voltage 114 (VCC). When the falling edge of pulsed signal 111 is applied to top switch and bottom switch, 100 short with 103 while 105 short with 107. Thus, capacitor resumes to supply voltage 114 (VCC).

Figure 2:
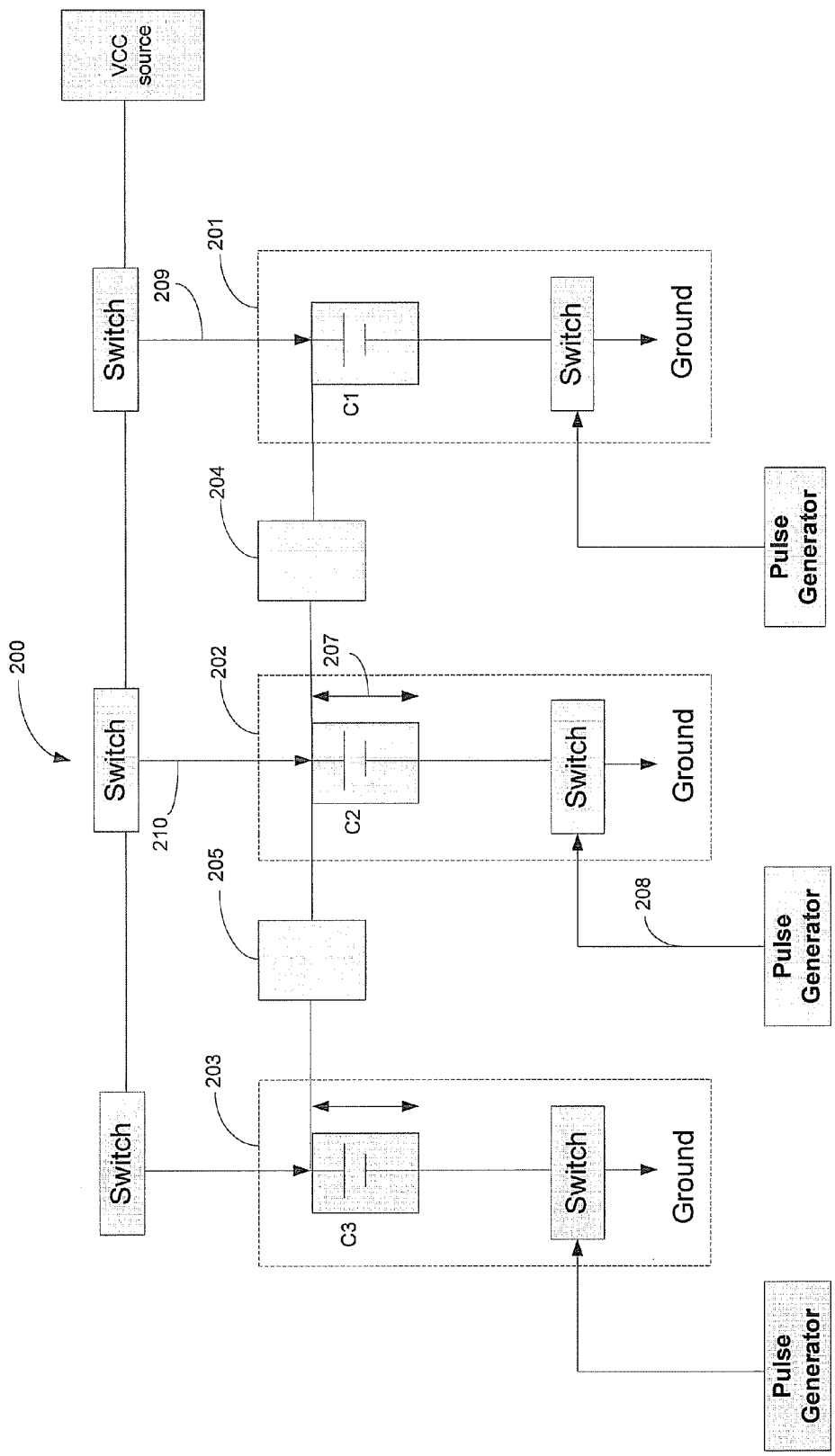
FIG. 2 illustrates an operation of an isolator between voltage boosting stages of an exemplary voltage booster circuit in accordance with a second aspect of the innovation.

FIG. 2 illustrates an operation of an isolator between voltage boosting stages of a voltage booster circuit 200. Three voltage boosting stages 201, 202, 203 include three boosting capacitors C1, C2, C3, respectively. Although three voltage boosting stages 201, 202, 203 and two isolators 204, 205 between the stages 201, 202, 203 are illustrated, it is also appreciated that the voltage booster circuit can include any suitable number of voltage boosting stages and any suitable number of isolators in the scope of the subject innovation.

In order to achieve a full boosted voltage for maximum efficiency, three capacitors (C1 through C3) can be fully charged up before three voltage boosting stages 201, 202, 203 are boosted up. When the first stage 201 is boosted up, the second stage 202 is also in a charging stage. In conventional memory devices, a capacitor of the second stage cannot be fully charged due to a capacitor of the first stage because boosting of one capacitor negatively affects a charge of an adjacent capacitor. Thus, a potential across the capacitor of the second stage is a value of a supply voltage minus some value caused by the flow of the charge from the first stage. As a result, the capacitor in the second stage is not fully charged up to a level of the supply voltage. This is inefficient for boosting the supply voltage because the potential across the capacitor of the second stage loses some value.

To overcome this deficiency and keep the charging stages stable, the isolator 204 is so constructed as to electrically isolate two capacitors C1, C2 from each other when one (e.g., C1) of the two capacitors C1, C2 boosts a supply voltage 209. The isolator 204 can be used to prevent boosting of the capacitor C1 from negatively affecting a charge of the other adjacent capacitor C2. In another embodiment, the isolator 205 is constructed to electrically isolate two capacitors C2, C3 from each other when one (e.g., C2) of the two capacitors C2, C3 boosts a read voltage 210. The isolator 205 can be used to prevent boosting of the capacitor C2 from negatively affecting a charge of the other adjacent capacitor C3.

When the first stage 201 is in a boosting stage, the second stage 202 is also in a charging stage. When the first voltage boosting stage 201 is boosted up, an isolator 204 is turned on to protect a capacitor C2. The capacitor C2 is electrically isolated away from the capacitor C1 being boosted. The second stage 201 receives a supply voltage 210 and starts charging the supply voltage 210. Because of the isolator 204, the capacitor C2 has substantially no leaky path or charge sharing to the capacitor C1, so its potential is kept to a full potential voltage 207. Because of the isolator 204, the capacitor C2 can be fully charged up to a level of the supply voltage 210. Thus, efficiency of the voltage booster can be improved. The capacitor C1 is held with the full potential voltage 207 and waiting for a pulse signal 208 to come in. After the first voltage boosting stage 201 is boosted up, the isolator 204 is turned off.

Thus, isolator 204 is not only an isolator but also a switch. For example, when pulsed signal goes high for C1, isolator 204 isolates C1 and C2 and switches open for C1 and C2. When pulsed signal goes high for C2, 205 isolates C2 and C3 and isolator/switch 204 closes to short C2 and C1 to create 3 times VCC on 209. When pulsed signal goes high for C3, 205 switches close to short C3 and C2 to create 4 times VCC on 209.

Figure 3:
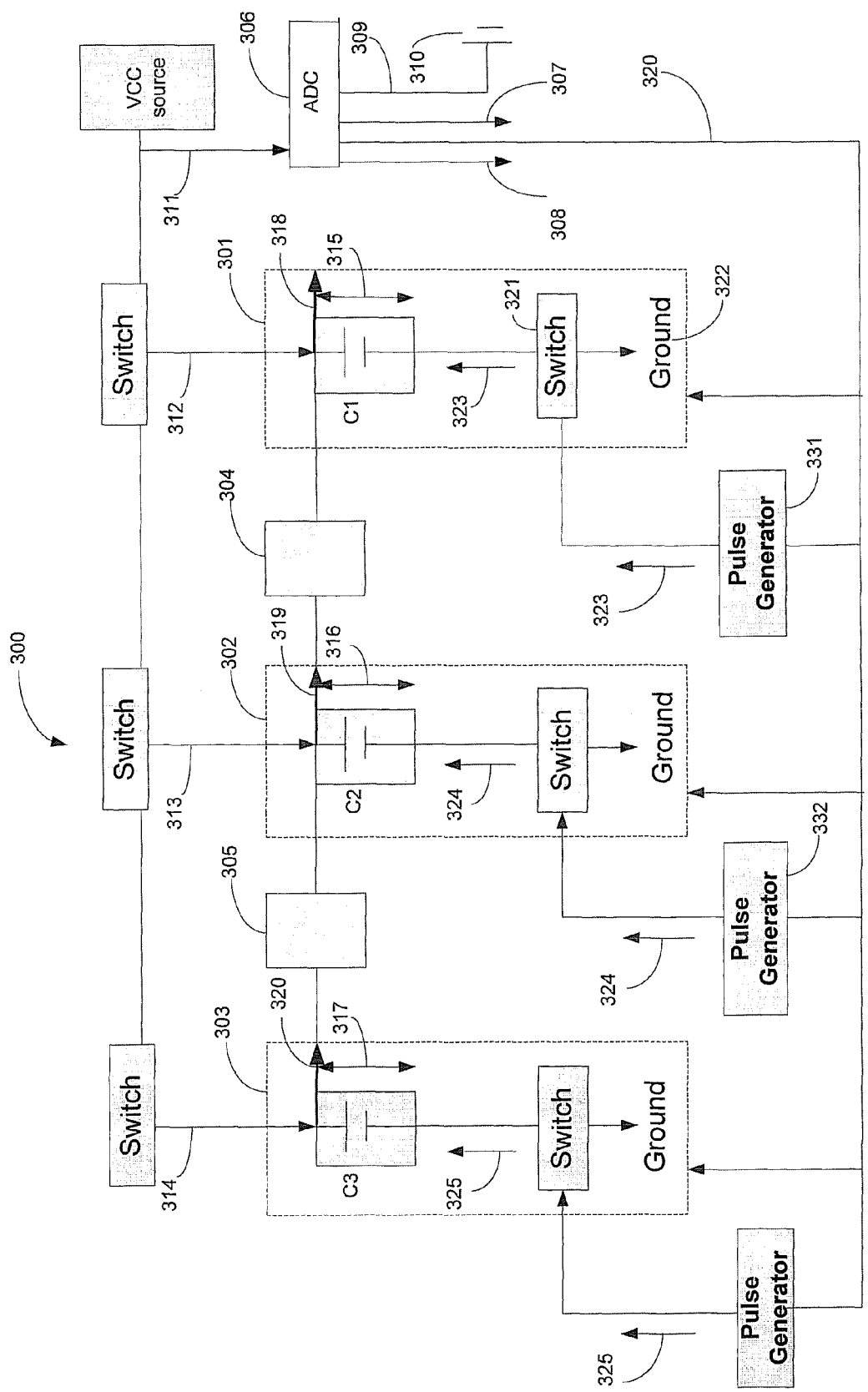
FIG. 3 illustrates an operation of an exemplary voltage booster circuit containing three voltage boosting stages connected in series, two isolators.

FIG. 3 illustrates an operation of a voltage booster circuit 300 containing three voltage boosting stages 301, 302, 303 connected in series, two isolators 304, 305, and a regulator 306. A first isolator 304 is between the voltage boosting stages 301, 302. A second isolator 305 is between the voltage boosting stages 302, 303. The regulator 306 is placed to receive a supply voltage 311 and a boosted output voltage 318, 319, 320 from each boosting stage 301, 302, 303. When the regulator 306 receives the supply voltage 311 and the boosted output voltage 318, 319, 320, a level detector (not shown in FIG. 3) within the ADC 306 measures a level of the supply voltage 311. A total output voltage is a sum of the supply voltage 311 and the boosted output voltages 318, 319, 320.

Reading information is accomplished by supplying a particular voltage (e.g., 9 volts, 2 volts, 1 volt, . . . ) across a selectively conductive media. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute memory cells, the specific architecture and device layout, and the like.

Generally speaking, the presence of an external stimuli such as an supplied electric field that exceeds a threshold value ("on" state) permits a supply voltage to write, read, or erase information into/from a memory cell; whereas the absence of the external stimuli that exceeds a threshold value ("off" state) prevents an supply voltage to write or erase information into/from a memory cell. If a supply voltage level is sufficient to exceed a read voltage threshold of a memory cell, then the memory cell is read.

Depending on the level of the supply voltage 311, the regulator 306 sends a disable next stage signal 307 or an enable next stage signal 308 on a node 320 to three voltage boosting stages 301, 302, 303. The disable next stage signal 307 is used to activate a reduction in the number of voltage boosting stages 301, 302, 303 of the voltage booster circuit 300. The enable next stage signal 308 is used to control an increase in the number of voltage boosting stages 301, 302, 303 of the voltage booster circuit 300.

When the ADC 306 receives the level of the supply voltage 311, the first stage 301 is turned on and also in a charging stage. A switch 321 in the first voltage boosting stage 301 is turned on. A capacitor C1 is connected to the supply voltage 312 and the ground 322. The capacitor C1 is fully charged up to the level of the supply voltage 312 and waiting for a pulsed signal 323 to come in while the ADC 306 measures the level of the supply voltage 311 and decides how many stages of booster is activated.

If the level of the supply voltage 311 is sufficient to exceed the read voltage threshold of a memory cell, the disable next stage signal 307 is active and sent to the stages 301, 302, 303 to turn off all voltage boosting stages 301, 302, 303. This operation can prevent over boosting. Although the capacitor C1 is fully charged up and waiting for a pulsed signal 323 to come in for boosting a charged voltage 315, the first stage 301 is turned off by the disable next stage signal 307. Thus, an operation of the first stage 301 is stopped at this point. In this case, the voltage booster circuit 300 allows passing the supply voltage 311 to a core cell gate 310.

If the level of supply voltage 311 is not sufficient to exceed a read voltage threshold of a memory cell, the ADC 306 commands a pulsed signal pump 331 to apply to a rising pulse signal 323 at the negative terminal polarity of the capacitor C1 to boost the charged voltage 315 to generate a boosted voltage 318. Also, an enable next stage signal 308 is active and is sent to the second stage 302, which is adjacent to the first stage 301. The second stage 302 is turned on and in a charging stage. When the first stage 301 is boosted up, an isolator 304 between the first stage 301 and the second stage 302 is turned on to protect a capacitor C2. The capacitor C2 is electrically isolated away from a capacitor C1 being boosted. The second stage 302 receives a supply voltage 313 and starts charging the supply voltage 313. Because of the isolator 304, the capacitor C2 can be fully charged up to a level of the supply voltage (VCC) 313. The capacitor C2 is held with a full potential voltage 316 and waiting for a pulse signal 324 to come in. After the first boosting stage 301 is boosted up, the isolator 304 is turned off.

By applying the rising pulse signal 323 at the negative terminal polarity of the capacitor C1, the charged voltage 315 is boosted up. A voltage of a positive terminal of the capacity C1 rises to 2 times the supply voltage 312 (2 times VCC). A boosted output voltage 318 of the first voltage boosting stage 301 is 2 times the supply voltage 312. At this point, a level of a total output voltage is a sum of a level of the supply voltage 311 (VCC) and a level of 2 times the supply voltage 312 (2×VCC).

If the level of the total output voltage (3 VCC) is sufficient to exceed the read voltage threshold of the memory cell, a disable next stage signal 307 is active. The regulator sends the disable next stage signal 307 to the second stage 302 and the third stage 303 to turn off the second stage 302 and third stage 303. This operation can prevent over boosting. Although the capacitor C2 is fully charged up and waiting for a rising pulse signal 324 to come in for boosting a charged voltage 316, the second stage 302 is turned off by the disable next stage signal 307. Thus, an operation of the second stage 302 is stopped at this point. In this case, the voltage booster circuit 300 allows passing the total output voltage (3 VCC) to a core cell gate 310.

If the level of the total output voltage is not sufficient to exceed the read voltage threshold of the memory cell, the regulator 306 commands a pulse signal pump 332 to apply to a rising pulse signal 324 at the negative terminal polarity of the C2 to boost the charged voltage 316 to generate a boosted voltage 319. Also, the enable next stage signal 308 is active and is sent to the third stage 303, which is adjacent to the second stage 302. The third stage 303 is turned on and in a charging stage. When the second stage 302 is boosted up, an isolator 305 between the second stage 302 and the third stage 303 is turned on to protect a capacitor C3. The capacitor C3 is electrically isolated away from the capacitor C2 being boosted. The third stage 303 receives a supply voltage 314 and starts charging the supply voltage 314. Because of the isolator 305, the capacitor C3 can be fully charged up to a level of the supply voltage 314. The capacitor C3 is held with a full potential voltage 317 and waiting for a pulse signal 325 to come in. After the second boosting stage 302 is boosted up, the isolator 305 is turned off.

By applying the rising pulse signal 324 at the negative terminal polarity of the capacitor C2, the charged voltage 316 is boosted up. A voltage of a positive terminal of the capacity C2 rises to 2 times the supply voltage 313 (2 times VCC). A boosted output voltage 319 of the second voltage boosting stage 302 is 2 times the supply voltage 313. At this point, a level of a total output voltage is a sum of a level of the supply voltage 311 (VCC), a level of 3 times the supply voltage 312 (3×VCC) generated by the first stage 301, and a level of 2 times the supply voltage 313 (2×VCC) generated by the second stage 302. The level of the total output voltage is compared with the threshold voltage level in the regulator 306.

This process continues until a sufficient total output voltage is generated on an output node 309, as detected by the level detector within the regulator 306. A voltage booster circuit 300 can accurately boost a supply voltage 312, 313, 314 with the suitable number of voltage boosting stages 301, 302, 303 depending on a level of a supply voltage 311, 312, 313, 314 being provided. The voltage booster circuit 300 can reduce or increase the number of stages 301, 302, 303 connected as a function of the level of the total output voltage produced. Thus, the voltage booster circuit 300 can attain a specified output voltage level, given the level of the supply voltage 311, 312, 313, 314.

Figure 4:
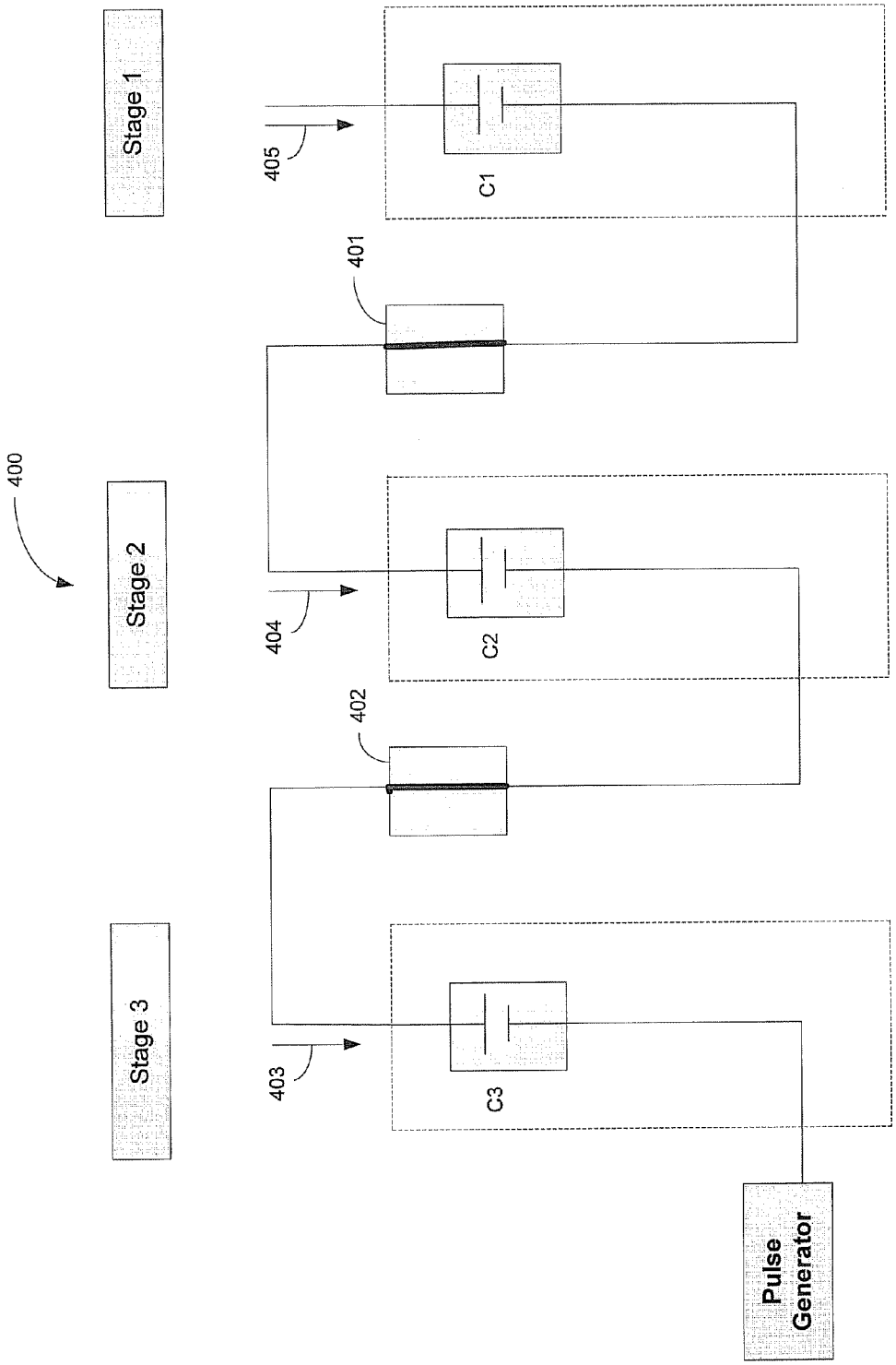
FIG. 4 illustrates how fully charged capacitors discharge boosted voltages in three discharging stages of an exemplary voltage booster circuit in accordance with a fourth aspect of the innovation.

FIG. 4 illustrates that how fully charged capacitors C1, C2, C3 discharge boosted voltages in three discharging stages of a voltage booster circuit 400. The relatively high supply voltage (VCC) cannot be simply discharged to the ground because it may violate a design rule of a memory cell. Thus, the relatively high supply voltage needs to be discharged stage by stage. To achieve such sequential discharge, the booster circuit 400 can contains three discharging stages and two isolators 401, 402 among the stages.

A capacitor having the lowest boosted voltage in the boosting circuit is first discharged. Although three discharging stages and two isolators 401, 402 between the stages are illustrated, it is also appreciated that the voltage booster circuit can include any suitable number of voltage discharging stages and any suitable number of isolators in the scope of the subject innovation.

As described in FIG. 1, each voltage boosting stage of a voltage booster circuit can double voltages, and/or triple voltages. Thus, before discharging a boosted voltage, in one embodiment, a potential across the capacitor C3 can have 2 times a supply voltage (2×VCC), a potential across the capacitor C2 can have 3 times the supply voltage (3×VCC) and a potential across the capacitor C1 can have 4 times the supply voltage (4×VCC). The capacitor C1 has the largest voltage. The capacitor C2 has the second largest voltage. The capacitor C3 has the third largest voltage.

If a supply voltage is 2 volt, the potential across the capacitor C1 is 8 volt. Since the 8 volt is a relatively high voltage, it may violate the design rule of a memory cell. Thus, the 8 volt needs to be discharged stage by stage. Since a voltage booster circuit 400 contains three discharging stages, the voltage booster circuit 400 can discharge the 8 volts sequentially. By sequentially discharging 8 volt, the capacitor C1 having the largest voltage can discharge the 8 volt safely.

In a first discharge stage, it is safe to discharge VCC on a stage 3 having the smallest voltage first because the potential across the capacitor C3 has only 2 times VCC (e.g., the lowest boosted voltage) which is safe to apply a falling edge signal 403. By applying the falling edge signal 403 at the positive terminal of the capacitor C3, the stage 3 discharges VCC. When the stage 3 discharges VCC, an isolator 402 is turned on to electrically isolates the capacitor C3 from the capacitor C2. The isolator 402 blocks substantially any flow of a charge from the capacitor C2 into the capacitor C3. Once the stage 3 is discharged, the potential across the capacitor C3 drops from the 2 times VCC to VCC, the potential across the capacitor C2 drops from 3 times VCC to 2 times VCC, and the potential across the capacitor C1 having the largest voltage drops from 4 times VCC to 3 times VCC.

In a second discharge stage, it is safe to discharge VCC on the stage 2 first since the potential across the capacitor C2 has only 2 times VCC (e.g., the lowest boosted voltage at this point) which is safe to apply a falling edge signal 404. The isolator 401 is turned on to electrically isolate the capacitor C2 from the capacitor C1. By applying the falling edge signal 404 at the positive terminal of the capacitor C2, the stage 3 discharges VCC.

Once the stage 2 discharges VCC, the potential across C2 drops from 2 times VCC to VCC and the potential across C1 drops from 3 times VCC to 2 times VCC which is safe to apply a falling edge signal 405. In a third discharging stage, the capacitor C1 is discharged by applying the falling edge signal 405 at the positive terminal of the capacitor C1 and the potential across the capacitor C1 drops from 2 times VCC to VCC.

FIG. 5 is a table 500 of potentials across three capacitors in three discharging stages of a voltage booster circuit. Before discharging a boosted voltage, the stage 3 has 2 times VCC, the stage 2 has 3 times VCC, and the stage 1 has 4 times VCC. In FIG. 5, discharges happen on all the three stages sequentially. The first discharge happens on stage 3. The second discharge happens on the stage 2. The third discharge happens on the stage 1.

Figure 6:
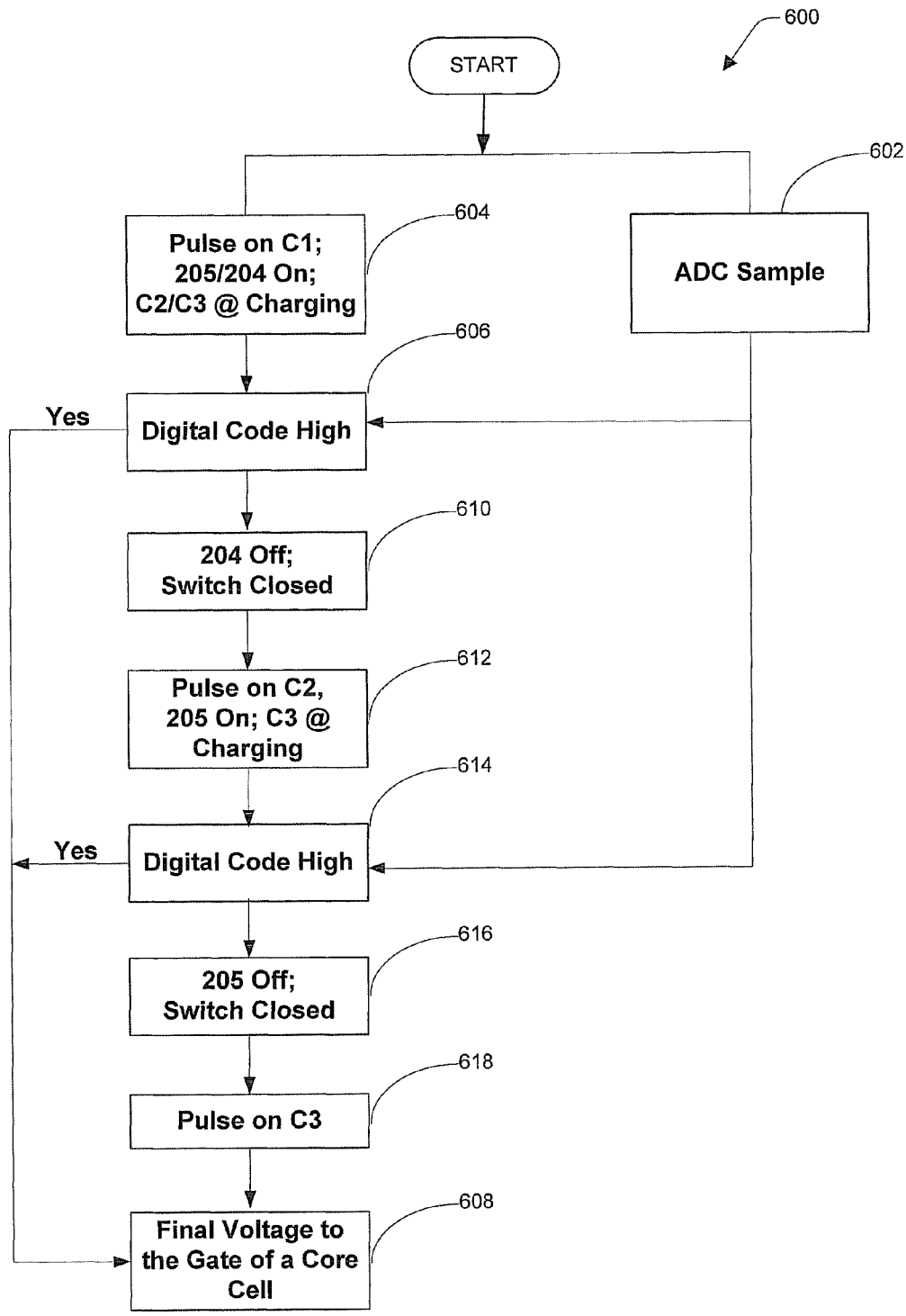
FIG. 6 illustrates a flow diagram of an exemplary method of increasing efficiency of a voltage booster for read mode operations and preventing a voltage over boosting in accordance with a sixth aspect of the innovation.

Referring now to FIG. 6, an example methodology 600 is disclosed for producing an efficient boost voltage, commonly the boost voltage is used in read operations. The system 200 of FIG. 2 can configure to implement the methodology 600—however, it is to be appreciated that various other configurations can be used to practice the methodology 600, such as using more then three capacitors. At event 602 an analog-to-digital converter (ADC) sample is provided; the sample can be used to determine if an adequate amount of voltage boost has been produced by actions, events, acts, and the like of the methodology 600.

At action 604, a pulse can be applied to capacitor C1 while capacitors C2 and C3 are charging. Isolators 204 and 205 are activated to block negative affects produced from the a boosted voltage upon C1. A check 606 can determine if a digital code is high from comparing a voltage outputted from practice of action 604 against the ADC sample (e.g., a boosted voltage is at an adequate level). If the code is high, then the methodology can continue to 608 where the voltage produced from the circuit configuration is applied to a gate of a core cell. However, if the digital code is not at an acceptable level (e.g., not high, commonly designated as low), then the methodology 600 can engage act 610. Act 610 can deactivate the isolator 204 and a closed switch occurs between C1 and C2. A pulse is then applied on C2 at event 612 while isolator 205 remains on and C3 continues charging.

A check 614 can determine if a digital code is high from comparing a voltage outputted from practice of action 612 against the ADC sample provided at event 602; thus is can implement near identically to the check 606, however different charged capacitors are used. If the code is high, then the methodology 600 can continue to 608 where the voltage produced from the circuit configuration is applied to the gate of the core cell. However, if the digital code is not at an acceptable level, then the methodology 600 can engage act 616. Act 616 can deactivate the isolator 205 and a closed switch occurs between C2 and C3. A pulse is then applied on C3 at event 618, typically without utilization of an isolator or charging another capacitor. Ultimately, a voltage outputted from application of a pulse upon C3 can be applied to the gate of the core cell.

Figure 7:
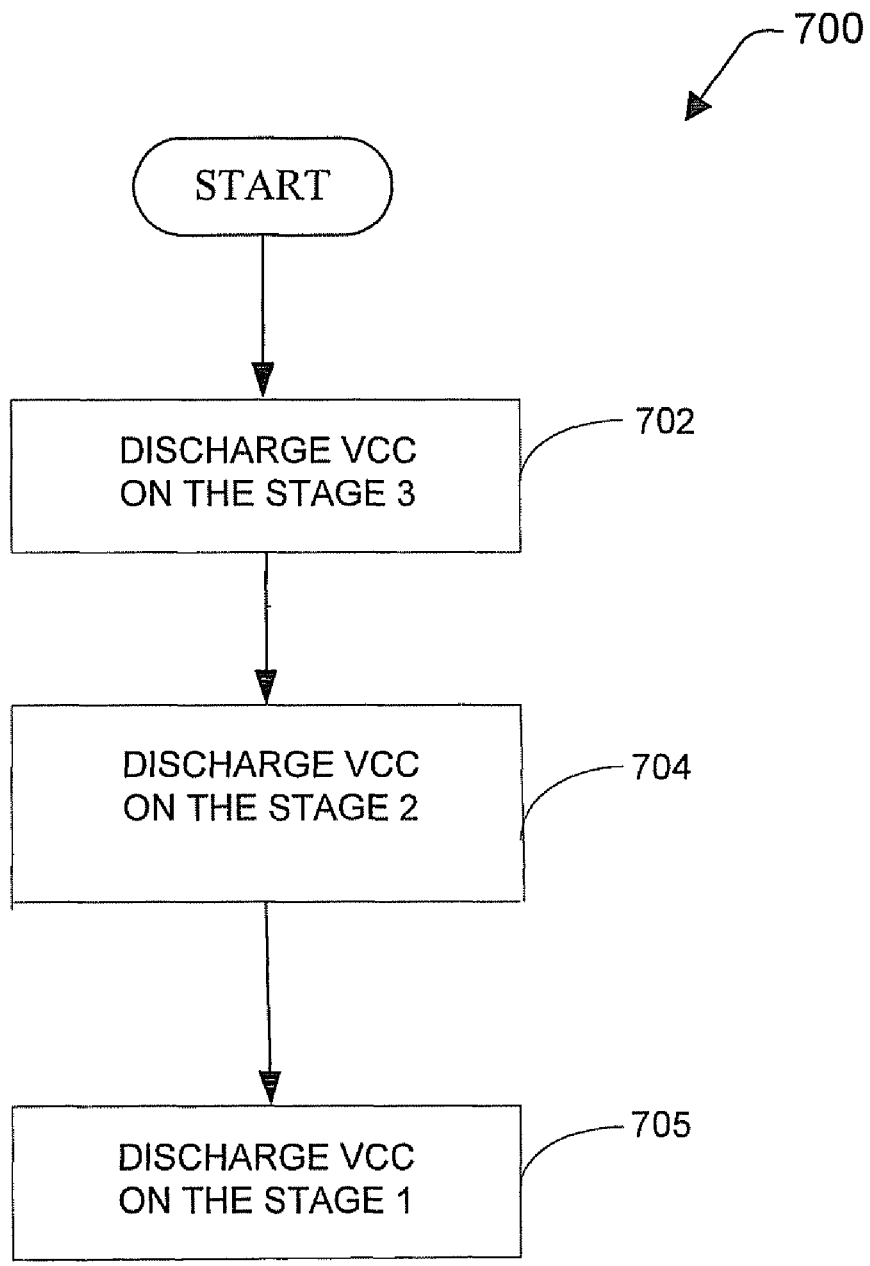
FIG. 7 illustrates a flow diagram of an exemplary method of a delayed sequential discharge in accordance with a seventh aspect of the innovation.

Referring to FIG. 7, a flow diagram of a method 700 of a delayed sequential discharge is depicted. The method 700 can be employed to discharge boosted voltages in any suitable number of stages of a voltage booster circuit. In this example, the method 700 includes three stages. When the voltage booster includes three stages, a potential across a capacitor in the third stage can have 2 times VCC, a potential across a capacitor in the second stage can have 3 times VCC and a potential across a capacitor in the first stage can have 4 times VCC before discharging the boosted voltage.

At reference number 702, the third stage discharges VCC. Once the third stage discharges VCC, the potential across the capacitor in the third stage drops from 2 times VCC to VCC. Also, the potential across the capacitor in the second stage drops from 3 times VCC to 2 times VCC which is safe to apply a falling edge pulse signal. The potential across the capacitor in the first stage drops from 4 times VCC to 3 times VCC. At reference number 704, the second stage discharges VCC. Once the second stage discharges VCC, the potential across the capacitor in the second stage drops from 2 times VCC to VCC and the potential across the capacitor in first second stage drops from 3 times VCC to 2 times VCC which is safe to apply the falling edge pulse signal. The potential across the capacitor in the first stage has only 2 times VCC. At reference number 705, the first stage discharges VCC.

What is described above includes examples of the innovation. It is, of course, not possible to describe every conceivable combination of components or methodologies for purposes of describing the innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for boosting a supply voltage of memory cells, comprising:
   employing a first boosting stage and a second boosting stage that are coupled in series to one another, the first boosting stage includes a first boosting capacitor and the second boosting stage includes a second boosting capacitor;
   controlling at least one of the first boosting stage or the second boosting stage in a voltage booster circuit by comparing a level of the supply voltage;
   the controlling includes at least one of the following:
      an increase of the number of boosting stages when the level of the supply voltage is below a threshold value; or
      a decrease of the number of boosting stages when the level of the supply voltage is above a threshold value;
   detecting a boost to the supply voltage by at least one of the first boosting capacitor or the second boosting capacitor; and
   utilizing an isolator to electrically isolate the first boosting capacitor and the second boosting capacitor from each other based upon the detected boost to the supply voltage by at least one of the first boosting capacitor or the second boosting capacitor, wherein the isolator is connected in series between the first boosting stage and the second boosting stage.

2. The method of claim 1, wherein controlling at least one of the first boosting stage or the second boosting stage comprises:
   sending at least one of an enable next stage signal or a disable next stage signal to a boosting stage in the voltage booster circuit according to a result of the comparisons; and
   activating the boosting stage that receives the enable next stage signal or deactivating the boosting stage that receives the disable next stage signal.

3. The method of claim 1, wherein at least one of the first boosting stage or the second boosting stage is turned on and in a charging stage when the level of the supply voltage is sampled.

4. The method of claim 1, wherein activating the boosting stage that receives the enable next stage signal comprises receiving the supply voltage and charging the supply voltage.

5. The method of claim 1, wherein deactivating the boosting stage that receives the disable next stage signal comprises turning off the boosting stage and stopping an operation of the boosting stage.

6. The method of claim 1, wherein deactivating the boosting stage that receives the disable next stage signal prevents over boosting.

7. The method of claim 1, wherein electrically isolating the first boosting capacitor and the second boosting capacitor from each other comprises turning on the isolator between the first boosting capacitor and the second boosting capacitor.

8. The method of claim 1 further comprising electrically isolating the first boosting capacitor and the second boosting capacitor from each other when one of the first boosting capacitor or the second boosting capacitor charges a supply voltage.

9. The method of claim 1, wherein electrically isolating the first boosting capacitor and the second boosting capacitor from each other prevents boosting of one of the first boosting capacitor or the second boosting capacitor from negatively affecting a charge of the other capacitor.

10. The method of claim 1, further comprising:
    activating the boosting stage that receives the enable next stage signal comprises receiving the supply voltage and charging the supply voltage; and
    deactivating the boosting stage that receives the disable next stage signal comprises turning off the boosting stage and stopping an operation of the boosting stage.

11. A method for discharging a boosted voltage of a boosting circuit comprising two or more capacitors, comprising:
    employing a first discharging stage and a second discharging stage that are coupled in series to one another, the first discharging stage includes a first capacitor and the second discharging stage includes a second capacitor, wherein the first capacitor and the second capacitor are fully charged;
    utilizing an isolator to electrically isolate the first capacitor and the second capacitor from each other, wherein the isolator is connected in series between the first discharging stage and the second discharging stage;
    evaluating a boost voltage related to a capacitor within a discharging stage of the boosting circuit;
    discharging the capacitor that has a lowest boosted voltage in comparison to a disparate capacitor within the discharging stages in the boosting circuit.

12. The method of claim 11, further comprising:
    sequentially discharging the capacitors that did not have the lowest boosted voltage within the discharging stages with a single and shared VCC.

13. The method of claim 12, further comprising:
    identifying the capacitor with a next lowest boosted voltage in comparison to a disparate capacitor within the discharging stages in the boosting circuit that has not been discharged;
    measuring a level of a supply voltage for the boosting circuit;
    discharging the capacitor with the next lowest boosted voltage until a potential across all the capacitors in the boosting circuit equal the level of the supply voltage.

14. The method of claim 11, further comprising:
    ranking the capacitors from low to high in regards to an amount of a boosted voltage;
    discharging the capacitors sequentially and one-by-one based on the ranking of the capacitors until potentials across all the capacitors in the boosting circuit equal a level of a supply voltage, the potentials across the capacitors is measured in between the sequential discharging of capacitors.

15. The method of claim 11, wherein electrically isolating the first capacitor and the second capacitor from each other includes turning on the isolator.

16. A voltage booster circuit of a memory device, comprising:
    a first boosting stage that includes a first boosting capacitor;
    a second boosting stage that includes a second boosting capacitor;
    a third boosting stage that includes a third boosting capacitor;

a first isolator connected in series between the first boosting stage and the second boosting stage, the first isolator electrically isolates the first boosting capacitor from the second boosting capacitor;

a second isolator connected in series between the second boosting stage and the third boosting stage, the second isolator electrically isolates the second boosting capacitor from the third boosting capacitor;

an analog-to-digital converter (ADC) that controls at least one of the boosting stages in the voltage booster circuit by comparing a level of a supply voltage;

the ADC provides at least one of the following:
　an increase of the number of boosting stages when the level of the supply voltage is below a threshold value; or
　a decrease of the number of boosting stages when the level of the supply voltage is above a threshold value;

the first isolator is activated to isolate when at least one of the first boosting capacitor or the second boosting capacitor boosts a supply voltage or discharges a boosted voltage; and the second isolator is activated to isolate when at least one of the second boosting capacitor or the third boosting capacitor boosts a supply voltage or discharges a boosted voltage.

17. The voltage booster circuit of claim 16, wherein the ADC comprises a level detector that measures at least one of a level of the supply voltage or a total output voltage.

18. The voltage booster circuit of claim 16, wherein the voltage boosting circuit comprises a set of pulse signal pumps.

19. The voltage booster circuit of claim 16, further comprising:
　an additional boosting stage that includes an additional boosting capacitor; and
　an additional isolator connected in series between the third boosting stage and the additional boosting stage, the additional isolator electrically isolates the third boosting capacitor from the additional boosting capacitor.

20. The voltage booster circuit of claim 16, further comprising the additional isolator is activated to isolate when at least one of the third boosting capacitor or the additional boosting capacitor boosts a supply voltage or discharges a boosted voltage.

* * * * *